(12) United States Patent
Hong et al.

(10) Patent No.: US 12,336,418 B2
(45) Date of Patent: Jun. 17, 2025

(54) DISPLAY DEVICE

(71) Applicant: Samsung Display Co., LTD., Yongin-si (KR)

(72) Inventors: Jongbeom Hong, Seongnam-si (KR); Yongsub Shim, Gwangmyeong-si (KR); Reehyang Kim, Hwaseong-si (KR); Youngjun Yoo, Goyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/443,537

(22) Filed: Feb. 16, 2024

(65) Prior Publication Data
US 2024/0237476 A1  Jul. 11, 2024

Related U.S. Application Data

(63) Continuation of application No. 17/528,477, filed on Nov. 17, 2021, now Pat. No. 11,943,992.

(30) Foreign Application Priority Data

Feb. 24, 2021  (KR) .................. 10-2021-0024787

(51) Int. Cl.
*H10K 59/65*  (2023.01)
*H10K 50/80*  (2023.01)
*H10K 50/86*  (2023.01)

(52) U.S. Cl.
CPC ........... *H10K 59/65* (2023.02); *H10K 50/865* (2023.02); *H10K 50/868* (2023.02)

(58) Field of Classification Search
CPC .... H10K 59/65; H10K 50/865; H10K 50/868; H10K 59/8792; H10K 59/60; H10K 59/126; H10K 59/127
See application file for complete search history.

(56) References Cited

U.S. PATENT DOCUMENTS

2016/0293687 A1  10/2016  Chang et al.
2019/0214596 A1  7/2019  Park
(Continued)

FOREIGN PATENT DOCUMENTS

KR  20160117728 A  10/2016
KR  20200013819 A  2/2020
(Continued)

OTHER PUBLICATIONS

PTO-0892 Notice(s) of References Cited (2 pages) and PTO-1449 Notice(s) indicating references considered by Examiner (4 pages), in related (parent) U.S. Appl. No. 17/528,477.

*Primary Examiner* — Donald L Raleigh
(74) *Attorney, Agent, or Firm* — CANTOR COLBURN LLP

(57) ABSTRACT

A display device includes an optical module, a light emitting structure, a lower substrate including a display area, and in order within the display area a first area corresponding to the optical module, second area adjacent to the optical module, and a third area including the light emitting structure, a light-transmitting filling layer in the first area and corresponding to the optical module, a light blocking layer in the second area and defining an opening corresponding to the light-transmitting filling layer in the first area, and an upper substrate facing the lower substrate with the light emitting structure and the light blocking layer therebetween.

20 Claims, 8 Drawing Sheets

(56) References Cited

U.S. PATENT DOCUMENTS

2019/0214601 A1   7/2019  Park
2020/0124910 A1   4/2020  Hwang et al.
2020/0321561 A1  10/2020  Park et al.

FOREIGN PATENT DOCUMENTS

KR      20200046222 A       5/2020
KR      20200118266 A      10/2020
WO   WO-2020243740 A1 *  12/2020   ........... G06F 3/0446

* cited by examiner

DISPLAY DEVICE

This application is a continuation application of U.S. application Ser. No. 17/528,477 filed Nov. 17, 2021, which claims priority to Korean Patent Application No. 10-2021-0024787 filed on Feb. 24, 2021, and all the benefits accruing therefrom under 35 U.S.C. § 119, the entire disclosure of which is incorporated herein by reference.

BACKGROUND

1. Field

Embodiments relate generally to a display device. More particularly, embodiments relate to a display device including an optical module.

2. Description of the Related Art

Flat panel display devices are used as display devices for replacing a cathode ray tube display device due to lightweight and thin characteristics of the flat panel display devices. As representative examples of such flat panel display devices, there are a liquid crystal display device and an organic light emitting diode display device.

The display device may be divided into a display area in which a light emitting structure is disposed to display an image, and a non-display area in which a gate driver, a data driver, wires, an optical module (e.g., a camera module, a face recognition sensor module, a pupil recognition sensor module, a proximity sensor module, a motion detection sensor module, an infrared sensor module, an illuminance sensor module, etc.), and the like are disposed. A display device in which an optical module is disposed in a part of the display area on a bottom surface of a lower substrate included in the display device has been developed. The light emitting structure may not be disposed on the lower substrate overlapping the part where the optical module is disposed.

SUMMARY

In a display device in which an optical module is in the display area on a bottom surface of a lower substrate of the display device and in which a light emitting structure is not disposed on the lower substrate overlapping the optical module, an image obtained from the optical module may be distorted by wavefront distortion of light collected by the optical module which is on the bottom surface of the lower substrate. In order to solve the above problem, a filling layer has been disposed on a top surface of the lower substrate to overlap the optical module, but a relatively greater amount of light emitted from the light emitting structure that is adjacent to the optical module may be introduced into the optical module. In this case, a defect may be caused in a captured image (or a video image) of the display device obtained through the optical module.

Embodiments provide a display device including an optical module which provides an improved image.

According to embodiments, a display device includes a lower substrate, an optical module, a light emitting structure, an upper substrate, a filling layer, and a light blocking layer. The lower substrate includes a first area, a second area surrounding the first area, and a third area surrounding the second area. The optical module is in the first area on a bottom surface of the lower substrate. The light emitting structure is in the third area on the lower substrate. The upper substrate is on the light emitting structure, and faces the lower substrate. The filling layer is in the first area on a bottom surface of the upper substrate. The light blocking layer is in the second area on the bottom surface of the upper substrate, and defines an opening overlapping the first area.

In embodiments, the light blocking layer may have a black color.

In embodiments, a shape of the opening of the light blocking layer may be determined according to a profile of an outer periphery of the optical module.

In embodiments, each of the upper substrate, the lower substrate, and the filling layer may have a refractive index of about 1.4 to about 1.6.

In embodiments, the upper substrate, the lower substrate, and the filling layer may have a substantially same refractive index.

In embodiments, each of the lower substrate and the upper substrate may include a quartz substrate, a synthetic quartz substrate, a calcium fluoride substrate, a fluorine-doped quartz substrate, a soda lime glass substrate, or a non-alkali glass substrate.

In embodiments, light incident from an outside may pass through the upper substrate, and may be transmitted through the filling layer and the lower substrate so as to be provided to the optical module.

In embodiments, the display device may further include a sensing structure in the third area and a part of the second area on the upper substrate.

In embodiments, the sensing structure may overlap a part of the light blocking layer.

In embodiments, the display device may further include a polarizing film layer in the third and second areas on the sensing structure.

In embodiments, the polarizing film layer may overlap the light blocking layer in the second area.

In embodiments, the display device may further include a cover window on the upper substrate.

In embodiments, light incident from an outside may pass through the cover window, and may be provided to the optical module through the opening of the light blocking layer. The light blocking layer may not overlap the optical module.

In embodiments, the display device may further include a semiconductor element structure overlapping the third area and a part of the second area between the light emitting structure and the lower substrate.

In embodiments, the semiconductor element structure may overlap a part of the light blocking layer in the second area.

In embodiments, the optical module may include a camera module, a face recognition sensor module, a pupil recognition sensor module, a proximity sensor module, a motion detection sensor module, an infrared sensor module, or an illuminance sensor module.

According to embodiments, a display device includes a lower substrate, an optical module, a light emitting structure, an upper substrate, a filling layer, and a light blocking layer. The lower substrate includes a first area, a second area surrounding the first area, and a third area surrounding the second area, and defines a through-opening formed in the first area. The optical module is in the through-opening of the lower substrate. The light emitting structure is in the third area on the lower substrate. The upper substrate is on the light emitting structure, and faces the lower substrate. The filling layer is between the upper substrate and the optical module. The light blocking layer is in the second area on a bottom surface of the upper substrate, and defines an opening overlapping the first area.

In embodiments, the filling layer may make contact with the optical module.

In embodiments, the light blocking layer may have a black color, and a shape of the opening of the light blocking layer may be determined according to a profile of an outer periphery of the optical module.

In embodiments, each of the upper substrate and the filling layer may have a refractive index of about 1.4 to about 1.6.

Since one or more embodiment of the display device includes the light blocking layer adjacent to the optical module, the light blocking layer may absorb light traveling in the direction from the third area to the second area among the light emitted from the light emitting layer that is adjacent to the second area. In this case, an amount of light introduced into the optical module may be relatively reduced. Accordingly, defects in a captured image of the display device obtained through the optical module may be reduced.

BRIEF DESCRIPTION OF THE DRAWINGS

Embodiments can be understood in more detail from the following description taken in conjunction with the accompanying drawings.

DETAILED DESCRIPTION

Figure 1:
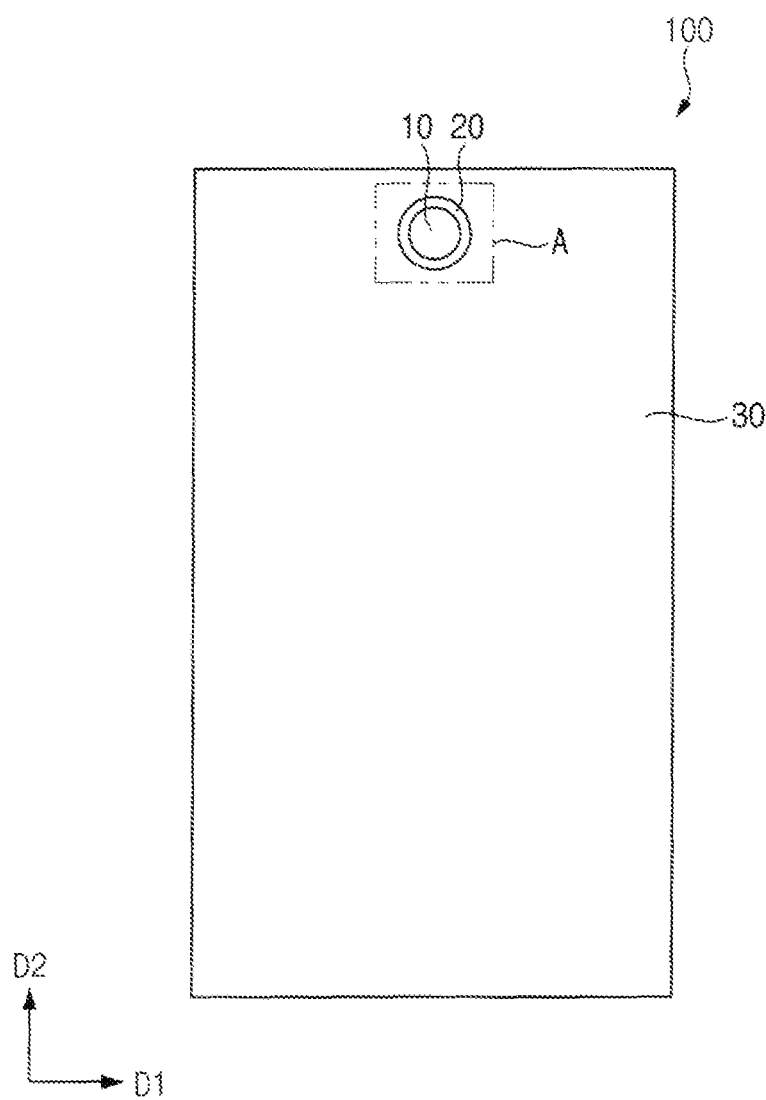
FIG. 1 is a plan view showing an embodiment of a display device.

Hereinafter, embodiments of display devices will be described in detail with reference to the accompanying drawings. In the accompanying drawings, same or similar reference numerals refer to the same or similar elements.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view showing an embodiment of a display device 100.

Referring to FIG. 1, a display device 100 may include a first area 10, a second area 20, and a third area 30. The second area 20 maybe between the first area 10 and the third area 30, without being limited thereto. The second area 20 maybe adjacent to the first area 10 and adjacent to the third area 30 along a plane (e.g., in a plan view). In this case, the second area 20 may substantially surround the first area 10, and the third area 30 may substantially surround the second area 20. In some embodiments, the third area 30 may not completely surround the second area 20.

In embodiments, each of the first area 10 and the second area 20 may have a circular shape when viewed in a plan view, and the third area 30 may have a rectangular shape when viewed in a plan view. The third area 30 may have a total planar area which includes a planar area of the second area 20 and a planar area of the first area 10, such that the first area 10 and the second area 20 maybe considered as "in" the third area 30. Various layers and components of the display device 100 may include a first area 10, a second area 20 and a third area 30 corresponding to those described above.

An optical module 700 (shown in FIG. 3) that will be described below may be disposed in or corresponding to the first area 10, and a light blocking layer 630 (shown in FIG. 3) that will be described below may be disposed in or corresponding to the second area 20. In addition, a light emitting structure 200 (e.g., light emitting element) (shown in FIG. 3) provided in plural including a plurality of light emitting structures 200, which will be described below, may be disposed in or corresponding to the third area 30. In other words, an image such as a video image may be displayed in the third area 30, and the first area 10 and the second area 20 may be non-display areas. In embodiments, a first non-display area (e.g., first area 10) and a second non-display area (e.g., second area 20) may be considered as "in" the display area (e.g., total planar area of the third area 30). The first non-display area may be considered as "in" the second non-display area in the plan view.

The light emitting structures 200 may be repeatedly arranged in the third area 30. In an embodiment, for example, the light emitting structures 200 may include a red (R) light emitting structure, a green (G) light emitting structure, and a blue (B) light emitting structure. The red, green, and blue light emitting structures may be arranged by using an RGB stripe scheme in which rectangles having the same size are sequentially arranged, an S-stripe scheme including a blue light emitting structure having a relatively large area, a WRGB scheme further including a white light emitting structure, a PenTile™ scheme in which RG-GB patterns are repeatedly arranged, or the like.

In addition, at least one driving transistor, at least one switching transistor, at least one capacitor, and the like may be disposed in the third area 30 to correspond to each of the light emitting structures 200.

However, although each of the first area 10 and the second area 20 has been described as having a circular shape when viewed in a plan view, the planar shape is not limited thereto. In an embodiment, for example, each of the first area 10 and the second area 20 may have a triangular shape, a rhombic shape, a polygonal shape, a rectangular shape, a track shape, or an elliptical shape when viewed in a plan view.

In addition, although the third area 30 has been described as having a rectangular shape when viewed in a plan view, the planar shape is not limited thereto. In an embodiment, for example, the third area 30 may have a triangular shape, a rhombic shape, a polygonal shape, a circular shape, a track shape, or an elliptical shape when viewed in a plan view.

Figure 2:
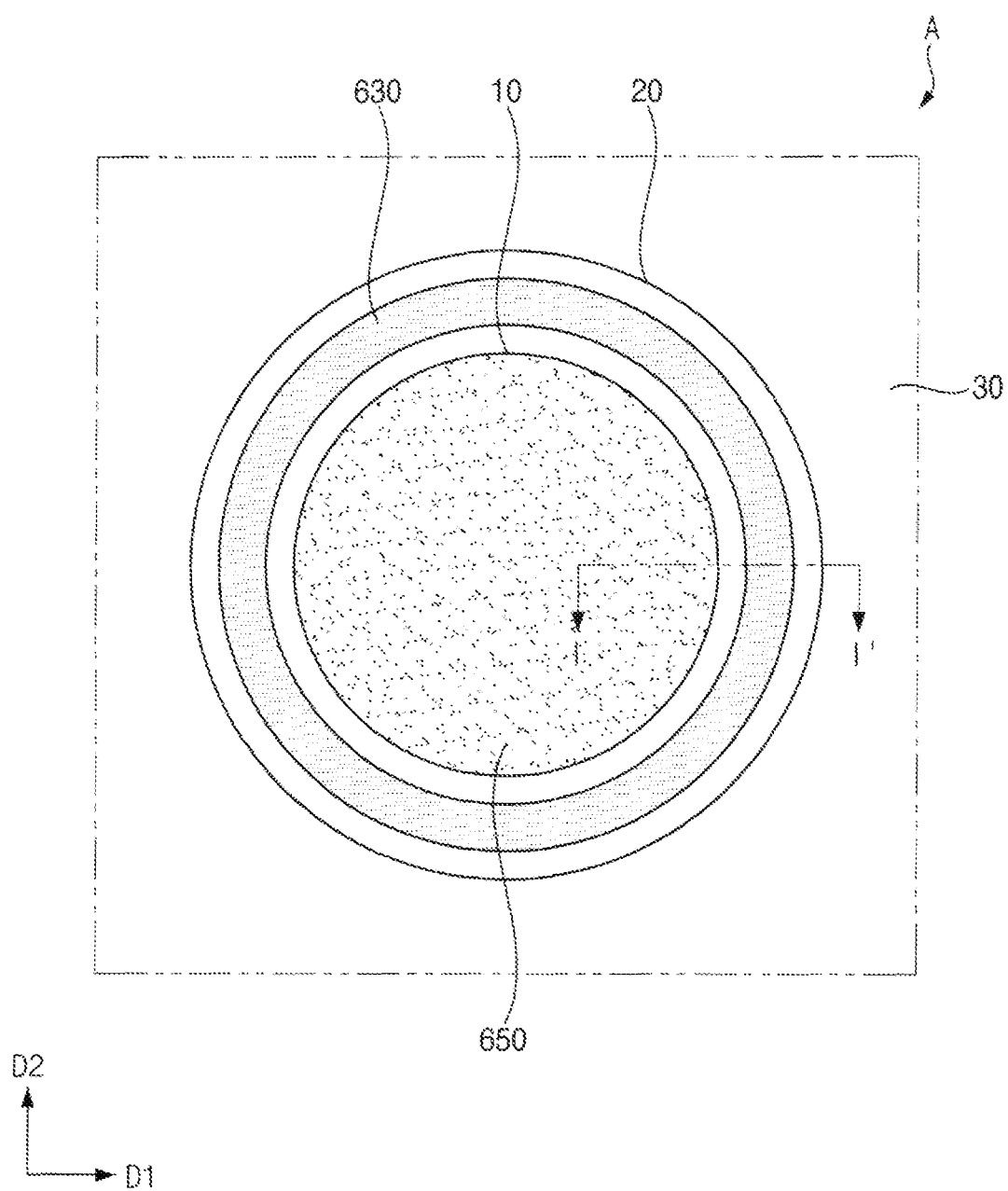
FIG. 2 is a partially enlarged plan view showing an embodiment of region A of FIG. 1.
Figure 3:
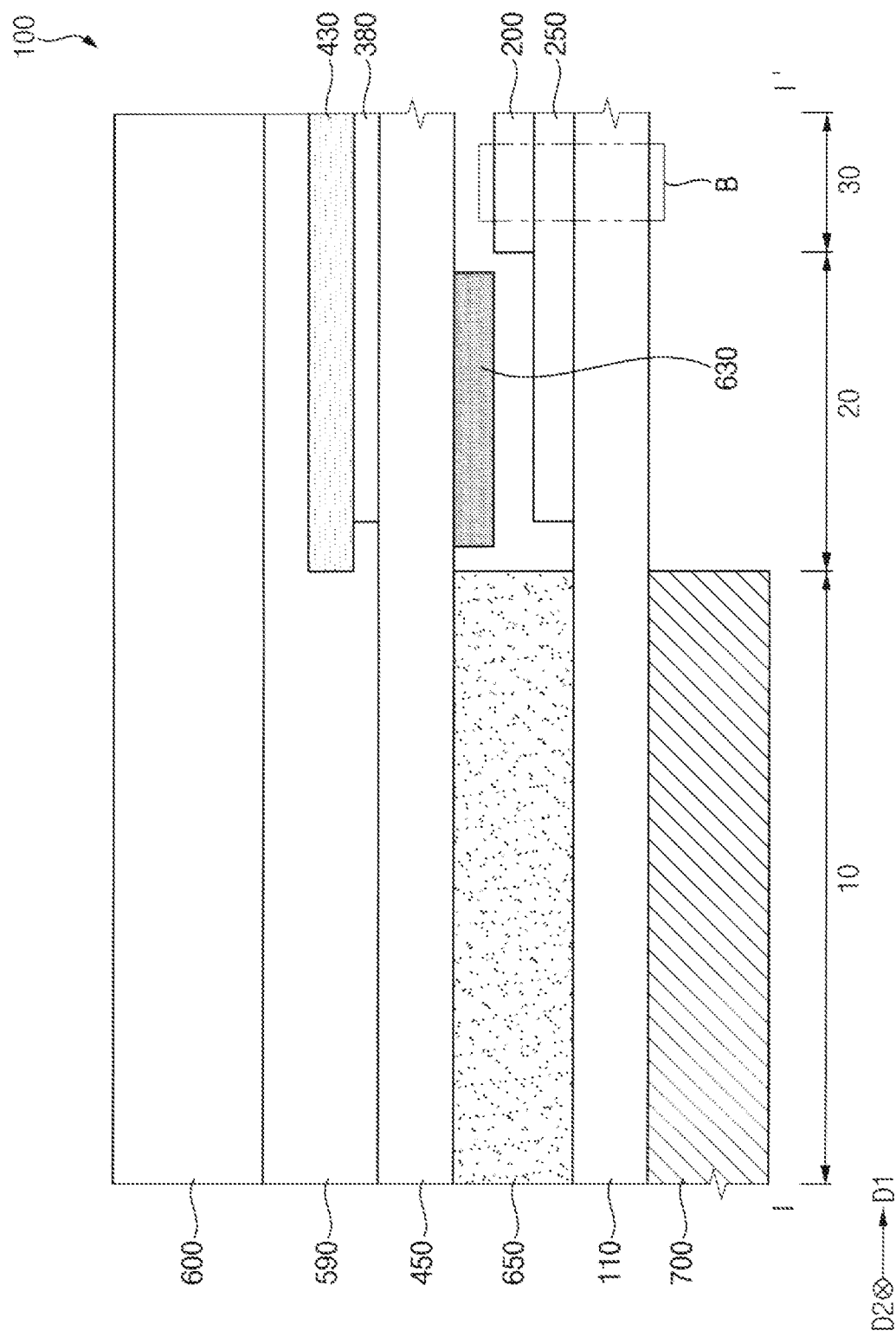
FIG. 3 is a cross-sectional view taken along line I-I' of FIG. 2.
Figure 4:
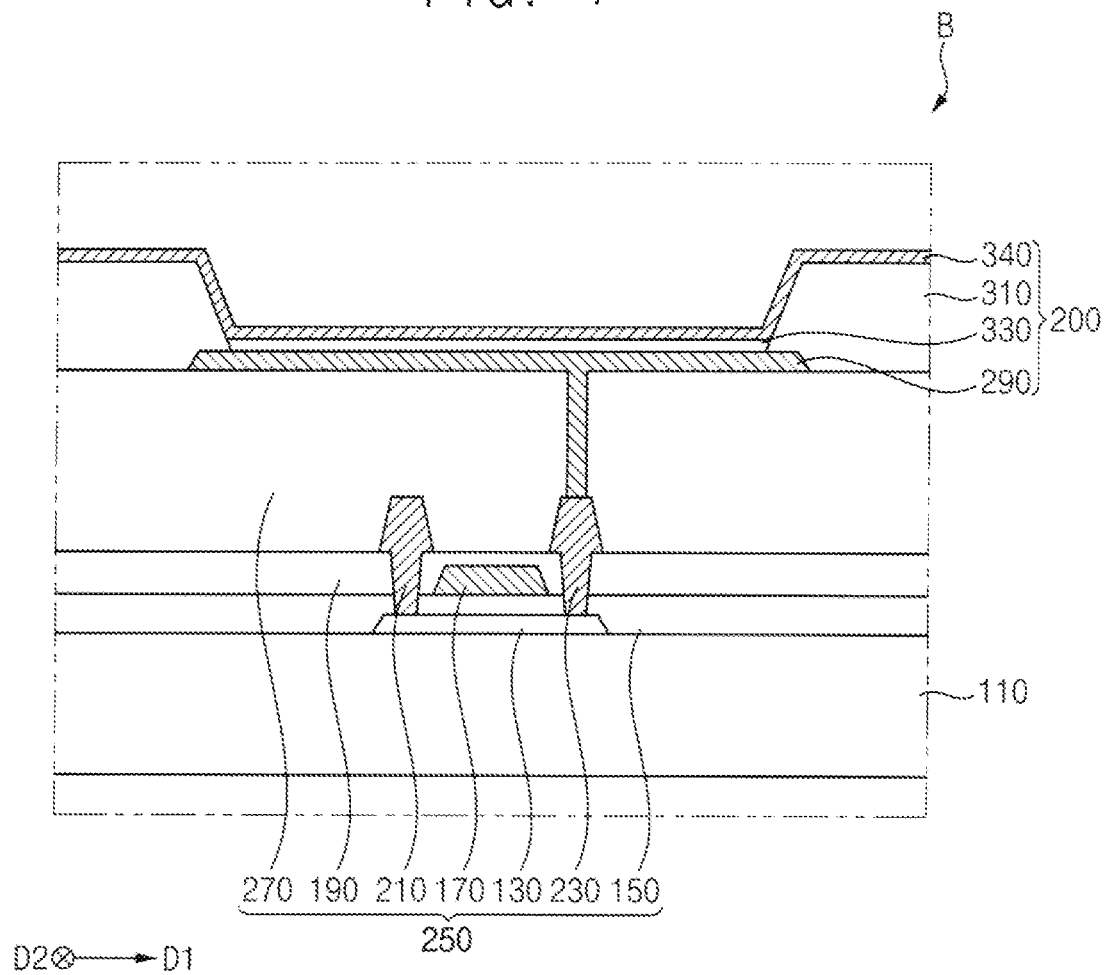
FIG. 4 is a partially enlarged cross-sectional view showing an embodiment of region B of FIG. 3.
Figure 5:
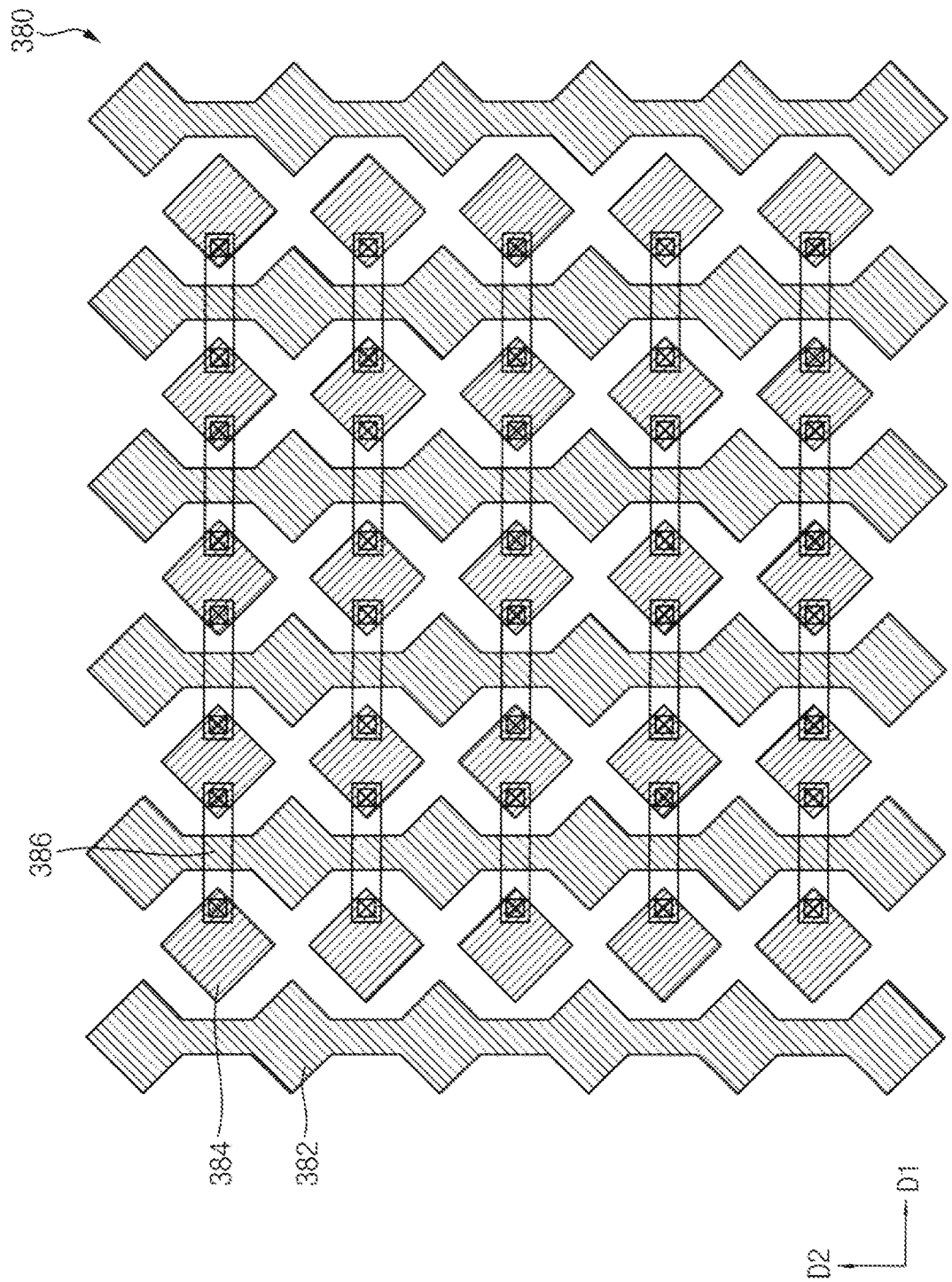
FIG. 5 is a plan view showing an embodiment of a sensing structure included in the display device of FIG. 3.

FIG. 2 is a partially enlarged plan view showing an embodiment of region A of FIG. 1, and FIG. 3 is a cross-sectional view taken along line I-I' of FIG. 2. FIG. 4 is a partially enlarged cross-sectional view showing an embodiment of region B of FIG. 3, and FIG. 5 is a plan view showing an embodiment of a sensing structure 380 (e.g., sensing layer) included in the display device 100 of FIG. 3.

The first area 10 shown in FIG. 2 may correspond to an inner area of a circle with which a leader line makes contact, and the second area 20 shown in FIG. 2 may correspond to a portion of the inner area of the circle with which the leader line makes contact except for the first area 10. In other words, FIG. 2 is a plan view showing a state in which a filling layer 650 is disposed in the first area 10 while a light blocking layer 630 (e.g., light blocking pattern) is disposed in the second area 20.

Referring to FIGS. 2, 3, 4, and 5, the display device 100 may include a lower substrate 110, a semiconductor element structure 250, a light emitting structure 200, an upper substrate 450, a filling layer 650, a light blocking layer 630, an optical module 700, a sensing structure 380, a polarizing film layer 430, an adhesive layer 590, a cover window 600, and the like. In this case, the semiconductor element structure 250 may include an active layer 130, a gate insulating layer 150, a gate electrode 170, an interlayer insulating layer 190, a source electrode 210, a drain electrode 230, and a planarization layer 270. The light emitting structure 200 may include a lower electrode 290 (e.g., first electrode), a pixel defining layer 310, a light emitting layer 330, and an upper electrode 340 (e.g., second electrode). The first electrode may face the second electrode with the light emitting layer 330 therebetween. In addition, the sensing structure 380 may include a first sensing electrode 382 provided in plural including a plurality of first sensing electrodes 382, a second sensing electrode 384 provided in plural including a plurality of second sensing electrodes 384, and a sensing connection electrode 386 provided in plural including a plurality of sensing connection electrodes 386.

Referring again to FIGS. 2 and 3, the lower substrate 110 including a transparent material may be provided. The lower substrate 110 may include a quartz substrate, a synthetic quartz substrate, a calcium fluoride substrate, a fluorine-doped quartz substrate (e.g., F-doped quartz substrate), a soda lime glass substrate, a non-alkali glass substrate, and the like.

In other embodiments, the lower substrate 110 may be a transparent resin substrate having flexibility. An example of the transparent resin substrate that may be used in the lower substrate 110 includes a polyimide substrate. In this case, the polyimide substrate may have a stacked structure including a first polyimide layer, a barrier film layer, a second polyimide layer, and the like.

Since the display device 100 includes the first area 10, the second area 20, and the third area 30, the lower substrate 110 may also be divided into a first area 10, a second area 20, and a third area 30.

The optical module 700 may be disposed in the first area 10 on a bottom surface of the lower substrate 110. A portion of the lower substrate 110 is between the filling layer 650 and the optical module 700. The first area 10 may correspond to the optical module 700. In the embodiments, a shape of the optical module 700 may be the same as a shape of the first area 10 when viewed in a plan view. In an embodiment, the optical module 700 may have a circular shape when viewed in a plan view. Light incident to the display device 100 from outside thereof (e.g., external light) may pass through the cover window 600, the adhesive layer 590, the upper substrate 450, the filling layer 650 and the lower substrate 110 in order, and the light may be provided to the optical module 700.

The optical module 700 may include a camera module, a face recognition sensor module, a pupil recognition sensor module, a proximity sensor module, a motion detection sensor module, an infrared sensor module, or an illuminance sensor module. That is, the optical module 700 may provide a function of the display device 100. In an embodiment, the optical module 700 receives external light from outside the display device 100 to provide the function of the display device 100. In the embodiments, the optical module 700 may be configured as a camera module. The camera module may function to collect the light incident from outside the display device 100, and the display device 100 may function to obtain an image from the camera module.

The semiconductor element structure 250 may be disposed in the third area 30 and a part of the second area 20 on the lower substrate 110, and the light emitting structure 200 may be disposed in the third area 30 on the semiconductor element structure 250. The light emitting structure 200 may be excluded from the second area 20 and the first area 10, without being limited thereto.

As shown in FIG. 4, the active layer 130 may be disposed in the third area 30 on the lower substrate 110. The active layer 130 may include a metal oxide semiconductor, an inorganic semiconductor (e.g., amorphous silicon or poly silicon), an organic semiconductor, or the like. The active layer 130 may include a source region, a drain region, and a channel region located between the source region and the drain region.

The gate insulating layer 150 may be disposed on the active layer 130. The gate insulating layer 150 may be disposed in the third area 30 and a part of the second area 20 on the lower substrate 110. Alternatively, the gate insulating layer 150 may extend in a direction from the third area 30 to the second area 20 to make contact with a side surface of the filling layer 650. As being in contact, elements may form an interface therebetween.

In an embodiment, for example, the gate insulating layer 150 may cover the active layer 130 on the lower substrate 110, and may have a substantially flat top surface without creating a step around the active layer 130. In some embodiments, the gate insulating layer 150 may be disposed along a profile of the active layer 130 with a uniform thickness to cover the active layer 130 on the lower substrate 110 and therefore have a non-flat top surface. The gate insulating layer 150 may include a silicon compound, metal oxide, and the like. In an embodiment, for example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In other embodiments, the gate insulating layer 150 may have a multilayer structure including a plurality of insulating layers. In an embodiment, for example, the insulating layers may have mutually different thicknesses, or may include mutually different materials.

The gate electrode 170 may be disposed in the third area 30 on the gate insulating layer 150. The gate electrode 170 may be disposed on a portion of the gate insulating layer 150 under which the active layer 130 is located (e.g., to overlap or correspond to the channel region of the active layer 130). The gate electrode 170 may include a metal, an alloy, metal nitride, conductive metal oxide, a transparent conductive material, and the like. The gate electrode 170 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide ("ITO"), tin oxide ($SnO_x$), indium oxide ($InO_x$), gallium oxide ($GaO_x$), indium zinc oxide ("IZO"), and the like. These may be used alone or in combination with each other. In other embodiments, the gate electrode 170 may have a multilayer structure including a plurality of metal layers. In an embodiment, for example, the metal layers may have mutually different thicknesses, or may include mutually different materials.

The interlayer insulating layer 190 may be disposed on the gate electrode 170. The interlayer insulating layer 190 may be disposed in the third area 30 and a part of the second area 20 on the gate insulating layer 150. In other embodiments, the interlayer insulating layer 190 may extend in the direction from the third area 30 to the second area 20 to make contact with the side surface of the filling layer 650.

In an embodiment, for example, the interlayer insulating layer 190 may cover the gate electrode 170 on the gate insulating layer 150, and may have a substantially flat top surface without creating a step around the gate electrode 170. In some embodiments, the interlayer insulating layer 190 may be disposed along a profile of the gate electrode 170 with a uniform thickness to cover the gate electrode 170 on the gate insulating layer 150 and therefore have a non-flat top surface. The interlayer insulating layer 190 may include a silicon compound, metal oxide, and the like. In other embodiments, the interlayer insulating layer 190 may have a multilayer structure including a plurality of insulating layers. In an embodiment, for example, the insulating layers may have mutually different thicknesses, or may include mutually different materials.

The source electrode 210 and the drain electrode 230 may be disposed in the third area 30 on the interlayer insulating layer 190. The source electrode 210 may be connected to the source region of the active layer 130 at or through a contact hole provided or formed such as by removing first portions of the gate insulating layer 150 and the interlayer insulating layer 190, and the drain electrode 230 may be connected to the drain region of the active layer 130 at or through a contact hole provided or formed such as by removing second portions of the gate insulating layer 150 and the interlayer insulating layer 190. Each of the source electrode 210 and the drain electrode 230 may include a metal, an alloy, metal nitride, conductive metal oxide, a transparent conductive material, and the like. These may be used alone or in combination with each other. In other embodiments, each of the source electrode 210 and the drain electrode 230 may have a multilayer structure including a plurality of metal layers. In an embodiment, for example, the metal layers may have mutually different thicknesses, or may include mutually different materials.

The planarization layer 270 may be disposed on the source electrode 210 and the drain electrode 230. The planarization layer 270 may be disposed in the third area 30 and a part of the second area 20 on the interlayer insulating layer 190. In other embodiments, the planarization layer 270 may extend in the direction from the third area 30 to the second area 20 to make contact with the side surface of the filling layer 650.

In an embodiment, for example, the planarization layer 270 may have a relatively large thickness. In this case, the planarization layer 270 may have a substantially flat top surface. In order to implement such a flat top surface of the planarization layer 270, a planarization process may be additionally performed on a material layer which provides the planarization layer 270. In some embodiments, the planarization layer 270 may be disposed along a profile of the source and drain electrodes 210 and 230 on the interlayer insulating layer 190 to therefore have a non-flat top surface. The planarization layer 270 may include or be formed of an organic insulating material or an inorganic insulating material. In the embodiments, the planarization layer 270 may include an organic insulating material. In an embodiment, for example, the planarization layer 270 may include a photoresist, a polyacryl-based resin, a polyimide-based resin, a polyamide-based resin, a siloxane-based resin, an acryl-based resin, an epoxy-based resin, and the like.

Accordingly, the semiconductor element structure 250 including the active layer 130, the gate insulating layer 150, the gate electrode 170, the interlayer insulating layer 190, the source electrode 210, the drain electrode 230, and the planarization layer 270 may be provided.

The lower electrode 290 may be disposed in the third area 30 on the planarization layer 270. The lower electrode 290 may include a metal, an alloy, metal nitride, conductive metal oxide, a transparent conductive material, and the like. These may be used alone or in combination with each other. In other embodiments, the lower electrode 290 may have a multilayer structure including a plurality of metal layers. In an embodiment, for example, the metal layers may have mutually different thicknesses, or may include mutually different materials. The light emitting structure 200 may be electrically connected to the semiconductor element structure 250 at the lower electrode 290, without being limited thereto. The semiconductor element structure 250 may control, drive, etc. the light emitting structure 200 to generate light, emit light, display an image, etc. The light emitting structure 200 and the semiconductor element structure 250 may together form a display element layer between the upper substrate 450 and the lower substrate 110, without being limited thereto. The display element layer together with the upper substrate 450 and the lower substrate 110 may define a display panel or display substrate.

The pixel defining layer 310 may be disposed in the third area 30 on the planarization layer 270. In other embodiments, the pixel defining layer 310 may extend in the direction from the third area 30 to the second area 20 to make contact with a side surface of the filling layer 650.

The pixel defining layer 310 may cover both side portions of the lower electrode 290, and may expose a part of a top surface of the lower electrode 290 to outside the pixel defining layer 310. A solid portion of the pixel defining layer 310 may define a light emitting opening at which the lower electrode 290 is exposed to outside the pixel defining layer 310. The pixel defining layer 310 may include or be formed of an organic insulating material or an inorganic insulating material. In the embodiments, the pixel defining layer 310 may include an organic insulating material.

The light emitting layer 330 may be disposed on the lower electrode 290. The light emitting layer 330 may have a multilayer structure including an organic light emission layer ("EML"), a hole injection layer ("HIL"), a hole transport layer ("HTL"), an electron transport layer ("ETL"), an electron injection layer ("EIL"), and the like. The organic light emission layer ("EML") of the light emitting layer 330 may be formed by using at least one of light emitting materials for emitting different color lights (e.g., a red light, a green light, a blue light, etc.) according to sub-pixels. Alternatively, the organic light emission layer ("EML") of the light emitting layer 330 may be formed by stacking a plurality of light emitting materials for generating different color lights such as a red light, a green light, and a blue light to emit white light as a whole. In this case, a color filter may be disposed on the light emitting layer 330 disposed on the lower electrode 290. The color filter may include at least one of a red color filter, a green color filter, and a blue color filter. In some embodiments, the color filter may include a yellow color filter, a cyan color filter, and a magenta color filter. The color filter may include a photosensitive resin or a color photoresist.

The upper electrode 340 may be disposed on the light emitting layer 330. Alternatively, the upper electrode 340 may extend in the direction from the third area 30 to the second area 20 so as to be disposed in a part of the second area 20.

The upper electrode 340 may include a metal, an alloy, metal nitride, conductive metal oxide, a transparent conductive material, and the like. These may be used alone or in combination with each other. In other embodiments, the upper electrode 340 may have a multilayer structure including a plurality of metal layers. In an embodiment, for example, the metal layers may have mutually different thicknesses, or may include mutually different materials.

Accordingly, the light emitting structure 200 including the lower electrode 290, the pixel defining layer 310, the light emitting layer 330, and the upper electrode 340 may be provided.

Referring again to FIGS. 2 and 3, the upper substrate 450 may be disposed on the light emitting structure 200, and the upper substrate 450 may face the lower substrate 110 with the filling layer 650, the light blocking layer 630, the light emitting structure 200 and the semiconductor element structure 250 therebetween. The upper substrate 450 may include substantially the same material as the lower substrate 110. In an embodiment, for example, the upper substrate 450 may include a quartz substrate, a synthetic quartz substrate, a calcium fluoride substrate, a fluorine-doped quartz substrate, a soda lime glass substrate, a non-alkali glass substrate, and the like.

In other embodiments, a thickness of the upper substrate 450 located in the first area 10 maybe smaller than a thickness of the upper substrate 450 located in the second and third areas 20 and 30. In this case, a part of a bottom surface of the upper substrate 450 located in the first area 10 maybe etched to have a relatively thin thickness. That is, the upper substrate 450 may be recessed from the bottom surface which is closest to the lower substrate 110, and in a direction away from the lower substrate 110 to provide a reduced thickness at the first area 10.

In addition, the upper substrate 450 located in the first area 10 may have a recessed shape in a direction from the upper substrate 450 to the lower substrate 110. In an embodiment, for example, since the sensing structure 380, the polarizing film layer 430, and the like are not disposed in the first area 10, the upper substrate 450 located in the first area 10 maybe recessed in the above direction in a sealing process of bonding the lower substrate 110 to the upper substrate 450.

The filling layer 650 may be disposed in the first area 10 on the bottom surface of the upper substrate 450. When the light incident from outside the display device 100 passes through a space between the upper substrate 450 and the lower substrate 110 in the first area 10, the filling layer 650 disposed between the upper substrate 450 and the lower substrate 110 in the first area 10 reduces or effectively prevents wavefront distortion of the external light.

In order to transmit the light, the filling layer 650 may be substantially transparent. In an embodiment, for example, the filling layer 650 may be formed of a material capable of transmitting light. The filling layer 650 may include an inorganic insulating material or an organic insulating material. The filling layer 650 may include transparent polyimide, a transparent photoresist, transparent acryl, transparent polyamide, transparent siloxane, transparent epoxy, and the like. In the embodiments, a refractive index of each of the lower substrate 110, the upper substrate 450, and the filling layer 650 may be about 1.4 to about 1.6. In an embodiment, the lower substrate 110, the upper substrate 450, and the filling layer 650 may have substantially the same refractive index.

In other embodiments, when the filling layer 650 has a low viscosity, the filling layer 650 may extend in a direction from the first area 10 to the second area 20 so as to make contact with a side surface of the light blocking layer 630 or the semiconductor element structure 250 in the second area 20 or so as to be disposed between the light blocking layer 630 and the semiconductor element structure 250 which are spaced apart from each other along a thickness direction of the display device 100. Referring to FIG. 3, the filling layer 650 may be coplanar with each of the light blocking layer 630 and the semiconductor element structure 250, without being limited thereto.

The light blocking layer 630 may be disposed in the second area 20 on the bottom surface of the upper substrate 450. The light blocking layer 630 may have or define an opening overlapping the first area 10. In other words, in order to provide the light incident from outside of the display device 100 to the optical module 700, the opening may expose the optical module 700 to outside the light blocking layer 630 on a plane of the display device 100, and the light blocking layer 630 may not overlap the optical module 700 (e.g., may be spaced apart from the optical module 700 along the plane). That is, a planar shape of the opening of the light blocking layer 630 may be determined according to a profile of an outer periphery of the optical module 700.

In the embodiments, the light blocking layer 630 may not overlap the light emitting structure 200 in order not to reduce luminance of light emitted from the light emitting structure 200. In other words, the light blocking layer 630 may be spaced apart from the light emitting structure 200 by an interval in consideration of a process margin in providing or forming the display device 100.

A boundary may be defined between the first area 10 and the second area 20 and between the second area 20 and the third area 30. In other embodiments, a portion of the light blocking layer 630 such as an end or side surface thereof may be aligned with a side surface of the light emitting structure 200 that is adjacent to or closest to a boundary between the second area 20 and the third area 30.

In order to reduce or effectively prevent a part of light emitted from the light emitting layer 330 included in the light emitting structure 200 from penetrating into the optical module 700, the light blocking layer 630 may be disposed between the optical module 700 and the light emitting structure 200 when viewed in a sectional view of the display device 100. In other words, the light blocking layer 630 may not overlap the light emitting structure 200 so that the remaining light among the light emitted from the light emitting layer 330 may be emitted in a direction from the lower substrate 110 to the upper substrate 450. However, a part of the light blocking layer 630 may overlap the semiconductor element structure 250 in the second area 20.

In order to absorb the light, the light blocking layer 630 may be opaque. In an embodiment, for example, the light blocking layer 630 may substantially have a black color. The light blocking layer 630 may include an organic material such as a photoresist, a polyacryl-based resin, a polyimide-based resin, a polyamide-based resin, a siloxane-based resin, an acryl-based resin, and an epoxy-based resin. In addition, the light blocking layer 630 may further include a light blocking material to absorb light. The light blocking material may include carbon black, titanium nitride oxide, titanium black, phenylene black, aniline black, cyanine black, nigrosine acid black, a black resin, and the like. In other embodiments, the light blocking layer 630 may be disposed over an entirety of the second area 20 on the bottom surface of the upper substrate 450. In this case, the light blocking layer 630 may make contact with the filling layer 650.

The sensing structure 380 may be disposed in the third area 30 and a part of the second area 20 on the upper substrate 450. In an embodiment, for example, the sensing structure 380 may be substantially transparent, and the light emitted from the light emitting structure 200 may pass through the sensing structure 380 in a direction from the lower substrate 110 to the cover window 600. The sensing structure 380 may not overlap the optical module 700. In other embodiments, a side surface of the sensing structure 380 that is adjacent to or closest to a boundary between the first area 10 and the second area 20 maybe aligned with a side surface of the light blocking layer 630 that is adjacent to or closest to the boundary between the first area 10 and the second area 20.

As shown in FIG. 5, each of the first sensing electrodes 382 may extend along a second direction D2, and the first sensing electrodes 382 may be spaced apart from each other along a first direction D1 crossing the second direction D2. The second sensing electrodes 384 may be spaced apart from each other along the second direction D2 and between two adjacent first sensing electrodes 382 among the first sensing electrodes 382. The display device 100 and various layers and components thereof may be disposed in a plane defined by the first direction D1 and the second direction D2 which crosses the first direction D1. A thickness direction of the display device 100 and various layers and components thereof may be taken along a third direction (e.g., vertical in FIGS. 3 and 4, for example) which crosses each of the first direction D1 and the second direction D2.

The sensing structure 380 may detect an external input such as a part of a user's body, an object, or the like located in front of the display device 100 (e.g., at the side of the cover window 600) through the first and second sensing electrodes 382 and 384. In the embodiments, the first and second sensing electrodes 382 and 384 may include a proximity sensor electrode configured to detect proximity with respect to the external input (e.g., the user or the object) located in front of the display device 100, or a touch sensor electrode configured to detect a touch of the external input (e.g., the part of the user body).

In an embodiment, for example, each of the first and second sensing electrodes 382 and 384 may include carbon nanotubes ("CNT"), transparent conductive oxide, indium tin oxide ("ITO"), indium gallium zinc oxide ("IGZO"), zinc oxide ("ZnO"), graphene, silver nanowires ("AgNW"), copper (Cu), chromium (Cr), and the like.

An insulating layer may be disposed on the first sensing electrodes 382 and the second sensing electrodes 384. The insulating layer may be disposed along a profile of the first and second sensing electrodes 382 and 384 with a uniform thickness to cover the first and second sensing electrodes 382 and 384. The insulating layer may include an organic insulating material or an inorganic insulating material. In some embodiments, the insulating layer may have a multi-layer structure including a plurality of insulating layers. In an embodiment, for example, the insulating layers may have mutually different thicknesses, or may include mutually different materials.

The sensing connection electrodes 386 may be disposed on the insulating layer. That is, the first and second sensing electrodes 382 and 384, the insulating layer and the sensing connection electrodes 386 may be disposed in order. The sensing connection electrodes 386 may electrically connect two second sensing electrodes 384 which are adjacent to each other along the first direction D1 among the second sensing electrodes 384, through a contact hole. In an embodiment, for example, the sensing connection electrodes 386 and the first and second sensing electrodes 382 and 384 may include the same material. In some embodiments, the sensing connection electrodes 386 may include a metal, an alloy, metal nitride, conductive metal oxide, a transparent conductive material, and the like. These may be used alone or in combination with each other.

Accordingly, the sensing structure 380 including the first sensing electrodes 382, the second sensing electrodes 384, the insulating layer, and the sensing connection electrodes 386 may be provided.

Referring again to FIGS. 2 and 3, the polarizing film layer 430 may be disposed in the third area 30 and the second area 20 on the sensing structure 380. The polarizing film layer 430 may overlap the light blocking layer 630 in the second area 20, and may not overlap the optical module 700. In some embodiments, an adhesive material layer may be disposed between the sensing structure 380 and the polarizing film layer 430.

The polarizing film layer 430 may include a linear polarizing film and a λ/4 phase retardation film. The λ/4 phase retardation film may be disposed on the sensing structure 380. The λ/4 phase retardation film may convert a phase of light. In an embodiment, for example, the λ/4 phase retardation film may convert a vertically oscillating light or a horizontally oscillating light into a right-handed circularly polarized light or a left-handed circularly polarized light, and may convert the right-handed circularly polarized light or the left-handed circularly polarized light into the vertically oscillating light or the horizontally oscillating light. The λ/4 phase retardation film may include a birefringent film including a polymer, an alignment film formed of a liquid crystal polymer, a film including an alignment layer formed of a liquid crystal polymer, and the like.

The linear polarizing film may be disposed on the λ/4 phase retardation film. The linear polarizing film may selectively transmit light. In an embodiment, for example, the linear polarizing film may transmit the vertically oscillating light or the horizontally oscillating light. In this case, the linear polarizing film may have a horizontal line pattern or a vertical line pattern. When the linear polarizing film includes the horizontal line pattern, the linear polarizing film may block the vertically oscillating light, and may transmit the horizontally oscillating light. When the linear polarizing film has the vertical line pattern, the linear polarizing film may block the horizontally oscillating light, and may transmit the vertically oscillating light. In an embodiment, for example, the linear polarizing film may include an iodine-based material, a dye-containing material, and a polyene-based material. In other embodiments, the polarizing film layer 430 may be disposed under the sensing structure 380. In still other embodiments, a color filter may be additionally provided on the bottom surface of the upper substrate 450, and the color filter may replace the polarizing film layer 430. In other words, when the display device 100 further includes the color filter, the polarizing film layer 430 may not be provided.

The cover window 600 may be disposed on the upper substrate 450 and the polarizing film layer 430. In other words, the cover window 600 may be disposed facing the upper substrate 450 with the adhesive layer 590, the polarizing film layer 430 and the sensing structure 380 therebetween. The cover window 600 may protect the polarizing film layer 430, the sensing structure 380, the light blocking layer 630, the filling layer 650, the light emitting structure 200, the semiconductor element structure 250, and the like. The cover window 600 may form an outer surface of the display device 100, without being limited thereto.

The cover window 600 may include a plurality of layers. In an embodiment, for example, the cover window 600 may include protective coating layers, base film layers, and the like formed of an organic material or an inorganic material. The protective coating layer may be disposed on the base film layer, and rigidity of the protective coating layer may be greater than rigidity of the base film layer in order to protect the base film layer. The base film layer may include polyimide, polyethylene terephthalate ("PET"), polyethylene naphthalene ("PEN"), polypropylene ("PP"), polycarbonate ("PC"), polystyrene ("PS"), polysulfone ("PSul"), polyethylene ("PE"), polyphthalamide ("PPA"), polyethersulfone ("PES"), polyarylate ("PAR"), polycarbonate oxide ("PCO"), modified polyphenylene oxide ("MPPO"), urethane, thermoplastic polyurethane ("TPU"), and the like. In addition, the protective coating layer may include an acryl-based material, an epoxy-based material, and the like. In other embodiments, the cover window 600 may have a single layer. For example, the cover window 600 may include ultra-thin glass ("UTG"), which is ultra-thin tempered glass.

The adhesive layer 590 may be disposed between the cover window 600 and the upper substrate 450. In other words, the adhesive layer 590 may be disposed to bond the cover window 600 to the upper substrate 450. In an embodiment, for example, the adhesive layer 590 may include an optical clear adhesive ("OCA") including acryl-based adhesives, silicon-based adhesives, urethane-based adhesives, rubber-based adhesives, vinyl ether-based adhesives, and the like, a pressure sensitive adhesive ("PSA"), an optical clear resin ("OCR"), and the like.

A sealing member may be disposed between the lower substrate 110 and the upper substrate 450 at an outermost periphery of the display device 100. The sealing member may make contact with the bottom surface of the upper substrate 450 which is closest to the lower substrate 110 and a top surface of the lower substrate 110 which is closest to the upper substrate 450. In some embodiments, at least one insulating layer may be interposed between a bottom surface of the sealing member and the top surface of the lower substrate 110. In the embodiments, the sealing member may include a non-conductive material. In an embodiment, for example, the sealing member may include a frit and the like. In addition, the sealing member may further include a photocurable material. In an embodiment, for example, the sealing member may include a combination of an organic material and a photocurable material, and the sealing member may be obtained by curing the combination by irradiating the combination with ultraviolet ("UV") light, laser light, visible light, or the like. The photocurable material included in the sealing member may include an epoxy acrylate-based resin, a polyester acrylate-based resin, a urethane acrylate-based resin, a polybutadine acrylate-based resin, a silicon acrylate-based resin, an alkyl acrylate-based resin, and the like.

In an embodiment, for example, the combination of the organic material and the photocurable material may be irradiated with the laser light. According to such irradiation of the laser light, the combination may be changed from a solid state to a liquid state, and the combination in the liquid state may be cured back to the solid state after a time. According to the state change of the combination, the upper substrate 450 may be coupled to the lower substrate 110 while elements therebetween are sealed with respect to the lower substrate 110.

Accordingly, the display device 100 including the lower substrate 110, the semiconductor element structure 250, the light emitting structure 200, the upper substrate 450, the filling layer 650, the light blocking layer 630, the optical module 700, the sensing structure 380, the polarizing film layer 430, the adhesive layer 590, and the cover window 600 may be provided.

In a conventional display device, an air layer exists in a first area 10 between a lower substrate 110 and an upper substrate 450 without a filling layer 650. When the air layer exists, since the lower and upper substrates 110 and 450 and the air layer have mutually different refractive indexes, wavefront distortion of external light (e.g., light incident from outside the conventional display device) may occur, so that an image obtained by function of an optical module 700 may be distorted. In order to solve the above problem, the filling layer 650 has been interposed in the first area 10 between the lower substrate 110 and the upper substrate 450. The filling layer 650 may have a refractive index that is similar to a refractive index of each of the lower and upper substrates 110 and 450. However, the filling layer 650 having the refractive index that is similar to the refractive index of each of the lower and upper substrates 110 and 450 increases an amount of light emitted from a light emitting layer 330 that is adjacent to a second area 20 and introduced into the optical module 700. In this case, as an amount of the light introduced into the optical module 700 increases, more defects have been caused in a captured image (or a video image) of the conventional display device obtained through the optical module 700.

Since one or more embodiment of the display device 100 includes the light blocking layer 630, light traveling in the direction from the third area 30 to the second area 20 among the light emitted from the light emitting layer 330 that is adjacent to the second area 20 maybe blocked or absorbed by the light blocking layer 630. In this case, an amount of light introduced into the optical module 700 may be relatively reduced by the light blocking function of the light blocking layer 630 in the second area 20. Accordingly, defects in a captured image of the display device 100 obtained through the optical module 700 may be reduced.

Although embodiments of the display device 100 have been described as being an organic light emitting diode display device including the light emitting structure 200 and the semiconductor element structure 250 as a display element layer, the invention is not limited thereto. In other embodiments, the display device 100 may include a liquid crystal display device ("LCD"), a field emission display device ("FED"), a plasma display device ("PDP"), an electrophoretic display device ("EPD"), and a quantum-dot organic light emitting display device ("QDOLED") having a respective display element layer.

Figure 6:
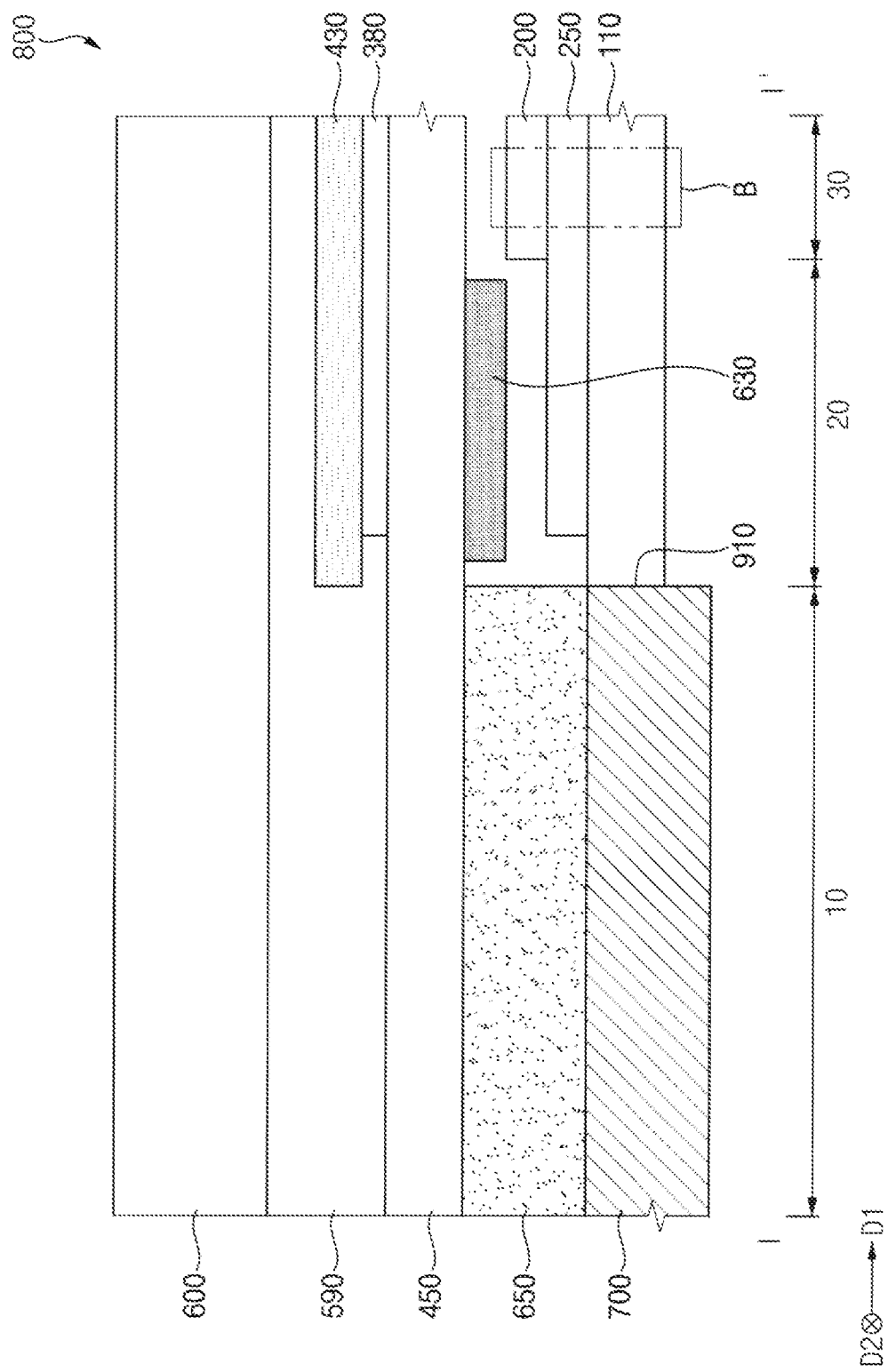
FIG. 6 is a cross-sectional view showing an embodiment of a display device.
Figure 7:
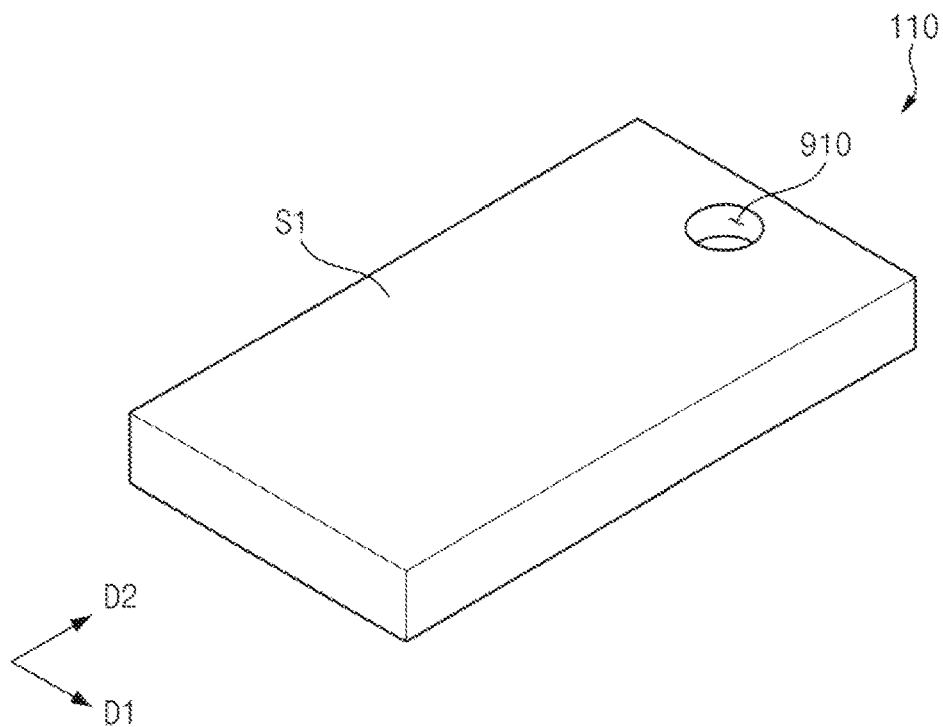
FIGS. 7 and 8 are perspective views showing embodiments of a lower substrate included in the display device of FIG. 6.
Figure 8:
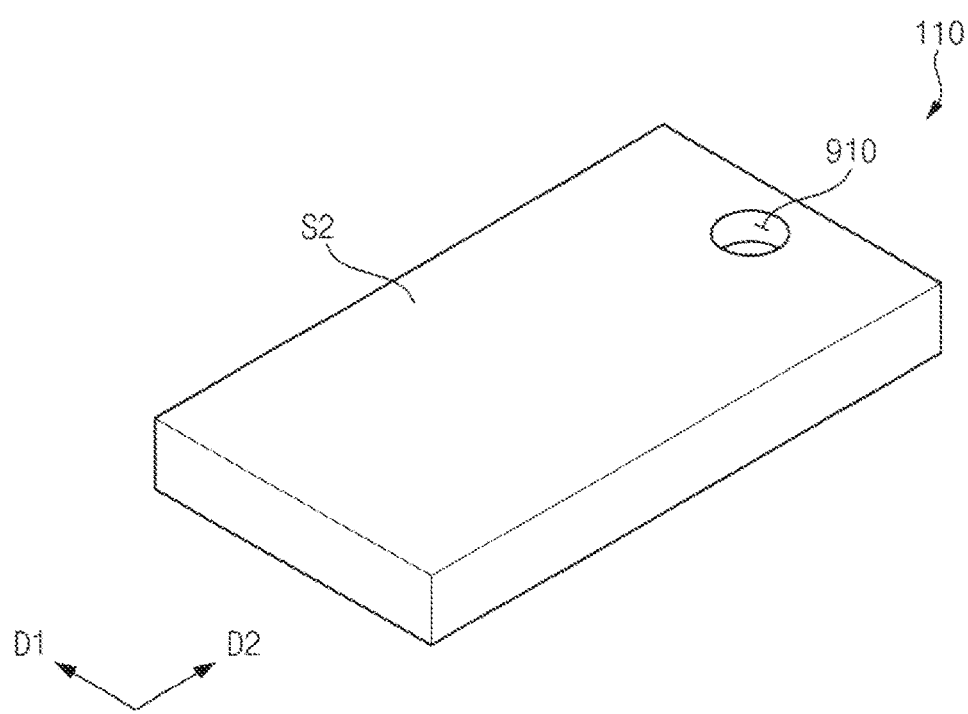
Figure 9:
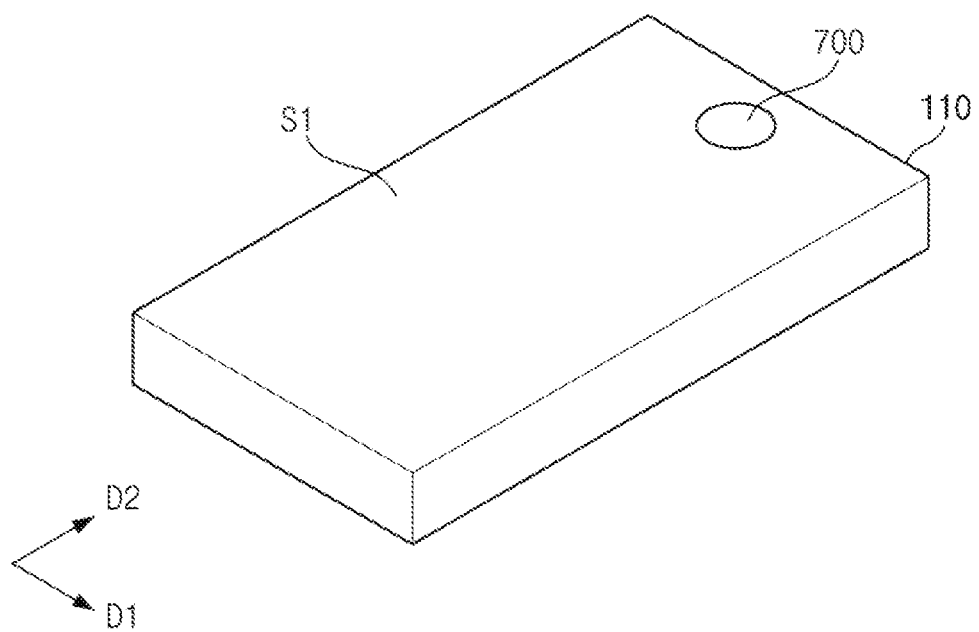
FIG. 9 is a perspective view showing an embodiment of the lower substrate and an optical module included in the display device of FIG. 6.

FIG. 6 is a cross-sectional view showing an embodiment of a display device 800, and FIGS. 7 and 8 are perspective views showing an embodiment of a lower substrate 110 included in the display device 800 of FIG. 6. FIG. 9 is a perspective view showing an embodiment of the lower substrate 110 and an optical module 700 included in the display device 800 of FIG. 6. For example, FIG. 7 is a perspective view showing a first surface S1 of the lower substrate 110, and FIG. 8 is a perspective view showing a second surface S2 of the lower substrate 110 which is opposite to the first surface S1.

A display device 800 illustrated in FIGS. 6 to 9 may have a configuration that is substantially identical or similar to the configuration of the display device 100 described with reference to FIGS. 1 to 5 except for a shape of the lower substrate 110. In FIGS. 6 to 9, redundant descriptions of components that are substantially identical or similar to the components described with reference to FIGS. 1 to 5 will be omitted.

Referring to FIGS. 6, 7, 8, and 9, the display device 800 may include a lower substrate 110, a semiconductor element structure 250, a light emitting structure 200, an upper substrate 450, a filling layer 650, a light blocking layer 630, an optical module 700, a sensing structure 380, a polarizing film layer 430, an adhesive layer 590, a cover window 600, and the like.

Referring again to FIGS. 7, 8, and 9, the lower substrate 110 including a transparent material may be provided. The lower substrate 110 may include a quartz substrate, a synthetic quartz substrate, a calcium fluoride substrate, a fluorine-doped quartz substrate, a soda lime glass substrate, a non-alkali glass substrate, and the like. In embodiments, the lower substrate 110 may include a through-opening 910 provided or formed in the first area 10. An inner side surface of the lower substrate 110 may define the through-opening 910.

The optical module 700 may be disposed in the through-opening 910. The optical module 700 in the through-opening 910 may extend further than an outer surface of the lower substrate 110 to dispose a portion of the optical module 700 outside of the lower substrate 110. The optical module 700 may be exposed to outside the lower substrate 110 at the through-opening 910. Referring to FIG. 7, the through-opening 910 may be open at the first surface S1 which is closest to the filling layer 650. Referring to FIG. 8, the through-opening 910 may be open at the second surface S2 which is furthest from the filling layer 650. In an embodiment, the through-opening 910 may extend through an entirety of the thickness of the lower substrate 110 to be open at both of opposing side surfaces thereof.

In other embodiments, a dimension such as a diameter of the optical module 700 along the first direction D1 and/or the second direction D2 may be greater than a dimension such as a diameter of the through-opening 910 along a corresponding direction. In this case, the filling layer 650 may be filled in the through-opening 910 of the lower substrate 110, and the optical module 700 may be disposed extended along on a bottom surface of the filling layer 650 and a bottom surface of the lower substrate 110 located in the second area 20 where such bottom surfaces are furthest from the upper substrate 450.

The filling layer 650 may be disposed between the upper substrate 450 and the optical module 700. That is, the lower substrate 110 may be omitted from between the filling layer 650 and the optical module 700, without being limited thereto. The filling layer 650 may be substantially transparent to transmit the light incident from outside the display device 800 and to the optical module 700. In an embodiment, for example, the filling layer 650 may be formed of a material capable of transmitting light (e.g., light-transmitting filling layer). The filling layer 650 may include an inorganic insulating material or an organic insulating material. The filling layer 650 may include transparent polyimide, a transparent photoresist, transparent acryl, transparent polyamide, transparent siloxane, transparent epoxy, and the like. In the embodiments, the bottom surface of the filling layer 650 may make contact with the optical module 700. That is, in the first area 10, the filling layer 650 may form a boundary or interface with both the upper substrate 450 and the optical module 700 without being limited thereto.

Embodiments disclosed herein may be applied to various electronic devices including a display device 100. Embodiment disclosed herein may be applied to numerous electronic devices such as vehicle-display devices, ship-display devices, aircraft-display devices, portable communication devices, exhibition display devices, information transfer display devices, medical-display devices, etc.

The foregoing is illustrative of embodiments and is not to be construed as limiting thereof. Although embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the embodiments disclosed herein, and that modifications to the disclosed embodiments, as well as other embodiments, are intended to be included within the scope of the appended claims.

What is claimed is:

1. A display device comprising:
    an optical module which provides a function of the display device;
    a light emitting structure;
    a substrate including:
        a display area, and
        in order within the display area:
            a first area corresponding to the optical module, and
            a second area surrounding the first area;
    a light blocking layer in the second area and defining an opening corresponding to the first area;
    a light-transmitting filling layer which is in the opening, corresponding to the optical module, and coplanar with the light blocking layer; and
    a cover layer which faces the substrate with the light emitting structure and the light blocking layer therebetween, the cover layer and the light-transmitting filling layer having different materials from each other,
    wherein a top surface of the light blocking layer contacts the cover layer, and a bottom surface of the light blocking layer faces the substrate.

2. The display device of claim 1, wherein the light blocking layer has a black color.

3. The display device of claim 1, wherein the opening of the light blocking layer has a shape, the optical module has an outer periphery defining a shape of the optical module, and the shape of the opening of the light blocking layer corresponds to the shape of the optical module.

4. The display device of claim 1,
    wherein a top surface of the light-transmitting filling layer contacts the cover layer, and a bottom surface of the light-transmitting filling layer contacts the substrate, and
    wherein the light-transmitting filling layer is spaced apart from the light blocking layer.

5. The display device of claim 4, wherein each of the cover layer, the substrate and the light-transmitting filling layer has a refractive index of about 1.4 to about 1.6.

6. The display device of claim 4, wherein the cover layer, the substrate and the light-transmitting filling layer have a same refractive index.

7. The display device of claim 4, wherein the optical module receives external light from outside the display device to provide the function of the display device, and
    wherein the external light transmits in order through the cover layer, the light-transmitting filling layer and the substrate to the optical module.

8. The display device of claim 1, further comprising:
    a sensing structure in the second area, the sensing structure sensing an external input to the display device.

9. The display device of claim 8, wherein in the second area the sensing structure corresponds to the light blocking layer.

10. The display device of claim 8, further comprising:
    a polarizing film layer in the second area.

11. The display device of claim 10, wherein in the second area the polarizing film layer corresponds to the light blocking layer.

12. The display device of claim 1, wherein the optical module receives external light from outside the display device to provide the function of the display device, and
    wherein the external light transmits in order through the cover layer and the substrate to the optical module.

13. The display device of claim 1, further comprising:
    a semiconductor element structure which is between the light emitting structure and the substrate in the second area and connected to the light emitting structure.

14. The display device of claim 13, wherein in the second area, the semiconductor element structure corresponds to the light blocking layer.

15. The display device of claim 1, wherein the optical module includes a camera module, a face recognition sensor module, a pupil recognition sensor module, a proximity sensor module, a motion detection sensor module, an infrared sensor module or an illuminance sensor module.

16. A display device comprising:
    an optical module which provides a function of the display device;
    a light emitting structure;
    a substrate including a through-opening defined therein, the substrate including:
        a display area, and
        in order within the display area:
            a first area corresponding to the through-opening defined in the substrate, the optical module extended into the through-opening, and
            a second area surrounding the first area;

a light blocking layer in the second area and defining an opening corresponding to the first area;
a light-transmitting filling layer which is in the opening, corresponding to the optical module, and coplanar with the light blocking layer; and
a cover layer which faces the substrate with the light emitting structure and the light blocking layer therebetween, the cover layer and the light-transmitting filling layer having different materials from each other,
wherein a top surface of the light blocking layer contacts the cover layer, and a bottom surface of the light blocking layer faces the substrate.

17. The display device of claim 16, wherein the light blocking layer has a black color.

18. The display device of claim 16, wherein the opening of the light blocking layer has a shape, the optical module has an outer periphery defining a shape of the optical module, and the shape of the opening of the light blocking layer corresponds to the shape of the optical module.

19. The display device of claim 16,
wherein a top surface of the light-transmitting filling layer contacts the cover layer, and a bottom surface of the light-transmitting filling layer contacts the optical module, and
wherein the light-transmitting filling layer is spaced apart from the light blocking layer.

20. The display device of claim 19, wherein each of the cover layer and the light-transmitting filling layer has a refractive index of about 1.4 to about 1.6.

* * * * *